(12) United States Patent
Park et al.

(10) Patent No.: US 8,999,744 B2
(45) Date of Patent: Apr. 7, 2015

(54) AVALANCHE PHOTODIODES AND METHODS OF FABRICATING THE SAME

(71) Applicant: Electronics and Telecommunications Research Institute, Daejeon (KR)

(72) Inventors: Mi-Ran Park, Daejeon (KR); O-Kyun Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/220,431

(22) Filed: Mar. 20, 2014

(65) Prior Publication Data
US 2014/0206130 A1 Jul. 24, 2014

Related U.S. Application Data

(62) Division of application No. 13/191,758, filed on Jul. 27, 2011, now Pat. No. 8,710,546.

(30) Foreign Application Priority Data

Nov. 3, 2010 (KR) .................. 10-2010-0108685

(51) Int. Cl.
*H01L 31/107* (2006.01)
*H01L 31/02* (2006.01)
*H01L 31/18* (2006.01)
*H01L 31/0216* (2014.01)

(52) U.S. Cl.
CPC ............ *H01L 31/107* (2013.01); *H01L 31/184* (2013.01); *H01L 31/02027* (2013.01); *H01L 31/02161* (2013.01); *Y02E 10/544* (2013.01)

(58) Field of Classification Search
CPC .................. H01L 31/107; H01L 31/02027
USPC ................. 438/72; 257/E31.063, E29.018, 257/E21.215
See application file for complete search history.

(56) References Cited

U.S. PATENT DOCUMENTS

| | | | | |
|---|---|---|---|---|
| 4,028,140 A | * | 6/1977 | Summers et al. | 438/531 |
| 4,636,829 A | * | 1/1987 | Greenwood et al. | 257/257 |
| 4,669,178 A | * | 6/1987 | Johnson | 438/529 |
| 5,539,221 A | | 7/1996 | Tsuji et al. | |
| 6,307,873 B1 | | 10/2001 | Geels et al. | |
| 7,807,489 B2 | * | 10/2010 | Takahashi et al. | 438/39 |
| 2006/0189027 A1 | | 8/2006 | Rhee | |
| 2008/0191241 A1 | | 8/2008 | Ishimura | |
| 2009/0050933 A1 | | 2/2009 | Shiba et al. | |

FOREIGN PATENT DOCUMENTS

| | | |
|---|---|---|
| JP | 2006-253548 A | 9/2006 |
| KR | 1999-0006160 | 1/1999 |
| KR | 10-0175441 B | 2/1999 |
| KR | 10-0617724 B1 | 8/2006 |

OTHER PUBLICATIONS

Anne Rouvié et al., "High Gain x Bandwidth Product Over 140-GHz Planar Junction AlInAs Avalanche Photodiodes", IEEE Photonics Technology Letters, vol. 20, No. 6, Mar. 15, 2008, pp. 455-457.

* cited by examiner

*Primary Examiner* — Kimberly Rizkallah
*Assistant Examiner* — Alexander Belousov
(74) *Attorney, Agent, or Firm* — Rabin & Berdo, P.C.

(57) ABSTRACT

Provided are an avalanche photodiode and a method of fabricating the same. The method of fabricating the avalanche photodiode includes sequentially forming a compound semiconductor absorption layer, a compound semiconductor grading layer, a charge sheet layer, a compound semiconductor amplification layer, a selective wet etch layer, and a p-type conductive layer on an n-type substrate through a metal organic chemical vapor deposition process.

5 Claims, 3 Drawing Sheets

AVALANCHE PHOTODIODES AND METHODS OF FABRICATING THE SAME

CROSS-REFERENCE TO RELATED APPLICATIONS

This is a divisional of co-pending U.S. application Ser. No. 13/191,758, filed on Jul. 27, 2011. This U.S. non-provisional patent application also claims priority under 35 U.S.C. §119 of Korean Patent Application No. 10-2010-0108685, filed on Nov. 3, 2010, the entire contents of which are hereby incorporated by reference.

BACKGROUND OF THE INVENTION

The present invention disclosed herein relates to photodiodes and methods of fabricating the same, and more particularly, to avalanche photodiodes and methods of fabricating the same.

A photodetector is essentially used in an optical communication system as a light-receiving device that receives light and converts the same into an electrical signal. Examples of the photodetector include PIN photodetectors and avalanche photodiodes. In particular, an InGaAs/InP avalanche photodiode used for ultrahigh-speed optical communication operates in a 1.3 μm or 1.5 μm long-wavelength region. What is important in the avalanche photodiode is a technology to form an amplification layer that generates avalanche multiplication for optical signal amplification.

Typically, a p-type indium phosphide layer (p-InP) is formed by diffusion and activation of zinc (Zn) atoms in a device region of an undoped indium phosphide layer (u-InP) to form a p-type conductive layer, and a uniform undoped indium phosphide layer (u-InP) is left to form an amplification layer. An amplification layer of an avalanche photodiode generates avalanche multiplication that affects the device characteristics. Therefore, in order to form an undoped indium phosphide layer (u-InP) with a uniform thickness, it is important to obtain an accurate zinc (Zn) diffusion depth, an interface and a uniform zinc (Zn) diffusion distribution layer.

SUMMARY OF THE INVENTION

The present invention provides an avalanche photodiode and a method of fabricating the same, which improves the operational characteristics and reliability of a device by accurately and reproducibly forming an amplification layer that generates avalanche multiplication.

In some embodiments of the present invention, a method of fabricating an avalanche photodiode includes: forming a compound semiconductor absorption layer, a compound semiconductor grading layer, a charge sheet layer, a compound semiconductor amplification layer, a selective wet etch layer, and a p-type conductive layer on an n-type substrate, wherein the compound semiconductor absorption layer, the compound semiconductor grading layer, the charge sheet layer, the compound semiconductor amplification layer, the selective wet etch layer, and the p-type conductive layer are sequentially formed on the n-type substrate through a metal organic chemical vapor deposition process.

In some embodiments, the method further includes: forming a p-type conductive mesa pattern by performing a plasma dry etch process on the p-type conductive layer; and forming an undercut region and a selective wet etch layer aperture pattern under the p-type conductive mesa pattern by performing a wet etch process on the selective wet etch layer by using the p-type conductive mesa pattern as an etch mask.

In other embodiments, the method further includes forming a dielectric layer to fill the undercut region and cover a portion of the p-type conductive mesa pattern and the compound semiconductor amplification layer.

In further embodiments, the dielectric layer is formed through an atomic layer deposition process.

In still further embodiments, the method further includes: forming an anti-reflective coating on the p-type conductive mesa pattern; forming a p-type metal electrode connected to the p-type conductive mesa pattern; and forming an n-type metal electrode connected to the n-type substrate, wherein the p-type conductive mesa pattern includes a light incidence region exposed by an opening of the p-type metal electrode, and a width of the light incidence region is larger than a width of the selective wet etch layer aperture pattern.

In still further embodiments, the method further includes: forming an anti-reflective coating on a bottom surface of the n-type substrate; forming an n-type metal electrode connected to the n-type substrate; and forming a p-type metal electrode connected to the p-type conductive mesa pattern, wherein the p-type conductive mesa pattern includes a light reflection region contacting the p-type metal electrode, and a width of the light reflection region is larger than a width of the selective wet etch layer aperture pattern.

In other embodiments of the present invention, an avalanche photodiode includes: a compound semiconductor absorption layer on an n-type substrate; a compound semiconductor grading layer on the compound semiconductor absorption layer; a charge sheet layer on the compound semiconductor grading layer; a compound semiconductor amplification layer on the charge sheet layer; a selective wet etch layer aperture pattern on the compound semiconductor amplification layer; and a p-type conductive mesa pattern on the selective wet etch layer aperture pattern.

In some embodiments, a width of the p-type conductive mesa pattern is larger than a width of the selective wet etch layer aperture pattern.

In other embodiments, the compound semiconductor absorption layer includes undoped indium gallium arsenide (InGaAs).

In further embodiments, the compound semiconductor grading layer includes undoped indium gallium arsenic phosphide (InGaAsP).

In still further embodiments, a band gap energy of the compound semiconductor grading layer increases away from the compound semiconductor absorption layer.

In still further embodiments, the charge sheet layer includes n-type indium phosphide (InP).

In still further embodiments, the compound semiconductor amplification layer includes undoped indium phosphide (InP).

In still further embodiments, the selective wet etch layer aperture pattern includes p-type indium aluminum arsenide (InAlAs).

In still further embodiments, the p-type conductive mesa pattern includes p-type indium phosphide (InP).

In still further embodiments, the avalanche photodiode further includes: an anti-reflective coating on the p-type conductive mesa pattern; a p-type metal electrode connected to the p-type conductive mesa pattern; and an n-type metal electrode connected to the n-type substrate, wherein the p-type conductive mesa pattern includes a light incidence region exposed by an opening of the p-type metal electrode, and a width of the light incidence region is larger than a width of the selective wet etch layer aperture pattern.

In still further embodiments, the avalanche photodiode further includes: an anti-reflective coating on a bottom surface of the n-type substrate; an n-type metal electrode connected to the n-type substrate; and a p-type metal electrode connected to the p-type conductive mesa pattern, wherein the p-type conductive mesa pattern includes a light reflection region contacting the p-type metal electrode, and a width of the light reflection region is larger than a width of the selective wet etch layer aperture pattern.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
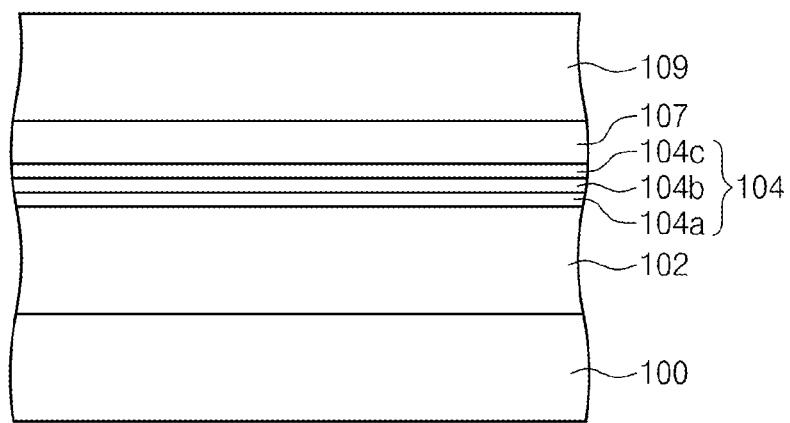
FIGS. 1 and 2 are cross-sectional views illustrating a method of fabricating a typical avalanche photodiode.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that when an element is referred to as being on another element, it may be directly on the other element or one or more intervening elements may also be present. In the drawings, the dimensions of elements are exaggerated for clarity of illustration. Like reference numerals refer to like elements throughout.

The embodiments will be described with reference to sectional views as ideal exemplary views of the present invention. In the drawings, the dimensions of layers and regions are exaggerated for clarity of illustration. Accordingly, shapes of the exemplary views may be modified according to fabrication techniques and/or allowable errors. Therefore, the embodiments of the present invention are not limited to the specific shape illustrated in the exemplary views, but may include other shapes that may be created according to fabrication processes. For example, an etched region illustrated as a rectangle may have rounded or curved features. Areas exemplified in the drawings have general properties, and are used to illustrate a specific shape of a device region. An embodiment described and exemplified herein includes a complementary embodiment thereof.

In the following description, the technical terms are used to describe exemplary embodiments without limiting the present invention. The terms of a singular form may include plural forms unless otherwise specified. The meaning of 'include', 'comprise', 'including', or 'comprising' specifies an element but does not exclude other elements.

Figure 2:
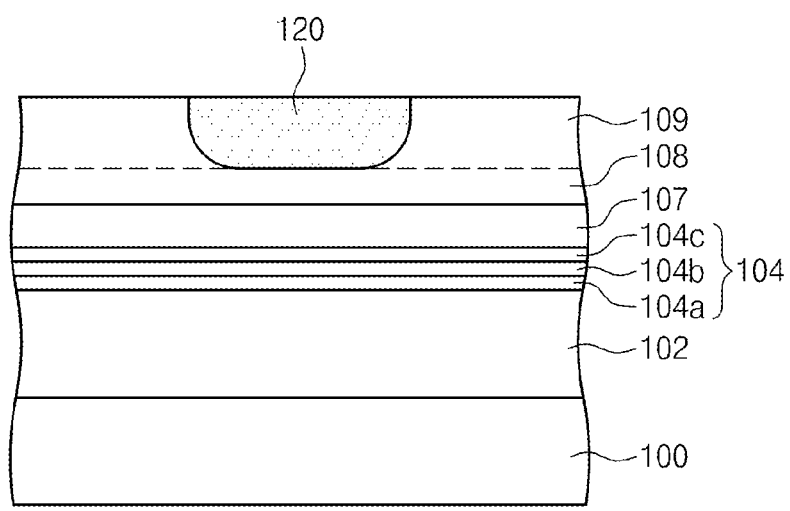

FIGS. 1 and 2 are cross-sectional views illustrating a method of fabricating a typical avalanche photodiode.

Referring to FIG. 1, a compound semiconductor absorption layer 102 is formed on an n-type substrate 100. The n-type substrate 100 may be formed of a compound semiconductor doped with n-type dopants. For example, the n-type substrate 100 may be formed of n-type indium phosphide (n-InP). The compound semiconductor absorption layer 102 may be formed of a compound semiconductor with a smaller band gap than the n-type substrate 100. For example, the compound semiconductor absorption layer 102 may be formed of indium gallium arsenide (InGaAs). The compound semiconductor absorption layer 102 may serve to absorb light. The compound semiconductor absorption layer 102 may be in an undoped state.

A compound semiconductor grading layer 104 is formed on the compound semiconductor absorption layer 102. The compound semiconductor grading layer 104 may be in an undoped state. The compound semiconductor grading layer 104 may include first, second and third grading layers 104a, 104b and 104c. The compound semiconductor grading layer 104 may be formed of indium gallium arsenic phosphide (InGaAsP). The composition ratio of the indium gallium arsenic phosphide (InGaAsP) may be varied to satisfy the band gaps that are suitable for the first, second and third grading layers 104a, 104b and 104c.

A charge sheet layer 107 is formed on the compound semiconductor grading layer 104. The charge sheet layer 107 may be formed of a compound semiconductor with a larger band gap than the compound semiconductor absorption layer 102. For example, the charge sheet layer 107 may be formed of n-type indium phosphide (n-InP). The compound semiconductor grading layer 104 may mitigate the band gaps of the compound semiconductor absorption layer 102 and the charge sheet layer 107. An undoped compound semiconductor layer 109 is formed on the charge sheet layer 107. For example, the undoped compound semiconductor layer 109 may be formed of indium phosphide (InP).

Referring to FIG. 2, a dopant diffusion layer 120 is formed in the undoped compound semiconductor layer 109. The dopant diffusion layer 120 may include zinc (Zn) or cadmium (Cd) as p-type dopants. For example, the dopant diffusion layer 120 may formed by diffusing zinc (Zn) in indium phosphide (InP). The dopant diffusion layer 120 may be formed through a diffusion process, for example, an annealing process and an activation process. Avalanche multiplication may be generated in an amplification layer 108 corresponding to the undoped compound semiconductor layer 109 without the dopant diffusion layer 120.

The dopant diffusion layer 120 is formed by diffusion. Therefore, an accurate diffusion depth control thereof is difficult, and a diffusion interface thereof is not uniform and may have a curved shape. Therefore, the thickness of the amplification layer 108 is not uniform in the device fabrication processes, thus making it difficult to secure the reproducibility thereof. Also, a high electric field is applied to a curved edge in the device operation, thus reducing the breakdown voltage thereof. Consequently, the avalanche photodiode may have a noise due to a low breakdown voltage, and the amplification characteristics of the device may degrade, thus reducing the sensitivity of the avalanche photodiode.

A region including an interface between the dopant diffusion layer 120 and the undoped compound semiconductor layer 109 may be identical to a light-incidence region of the avalanche photodiode. Meanwhile, the capacitance affecting the operation speed of the avalanche photodiode may be determined by the area of the region including the interface. Therefore, in order to reduce the parasitic capacitance, it is necessary to reduce the area of the region including the interface. However, when the interface decreases, the light-incidence region decreases. In this case, the alignment margin of module packaging of the avalanche photodiode may decrease, thus reducing the sensitivity of the avalanche photodiode. In the result, forming the dopant diffusion layer 120 and the amplification layer 108 through the diffusion process may degrade the reliability of the device.

FIGS. 3 to 6 are cross-sectional views illustrating a method of fabricating an avalanche photodiode according to an exemplary embodiment of the present invention.

Figure 3:
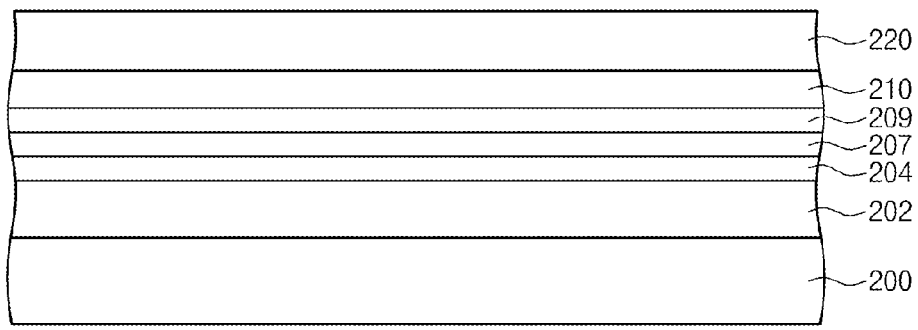
FIGS. 3 to 6 are cross-sectional views illustrating a method of fabricating an avalanche photodiode according to an exemplary embodiment of the present invention.

Referring to FIG. 3, a compound semiconductor absorption layer 202 is formed on an n-type substrate 200. The n-type substrate 200 may be formed of a compound semiconductor including n-type dopants. For example, the n-type substrate 200 may be formed of n-type indium phosphide (n-InP). The compound semiconductor absorption layer 202 may be formed of a compound semiconductor with a smaller band gap than the n-type substrate 200 and/or a subsequent undoped compound semiconductor amplification layer 209. For example, the compound semiconductor absorption layer 202 may be formed of indium gallium arsenide (InGaAs). The compound semiconductor absorption layer 202 absorbs light in the avalanche photodiode. The compound semiconductor absorption layer 202 may be formed to be in an intrinsic state.

A compound semiconductor grading layer 204 is formed on the compound semiconductor absorption layer 202. The compound semiconductor grading layer 204 may be in an undoped state. A charge sheet layer 207 is formed on the compound semiconductor grading layer 204. The charge sheet layer 207 may be formed of a compound semiconductor with a larger band gap than the compound semiconductor absorption layer 202. For example, the charge sheet layer 207 may be formed of indium phosphide (InP). The charge sheet layer 207 may include n-type dopants.

The compound semiconductor grading layer 204 may mitigate the abrupt difference of the band gaps between the compound semiconductor absorption layer 202 and the charge sheet layer 207. For example, the compound semiconductor grading layer 204 may be formed of a compound semiconductor with a band gap that is larger than the band gap of the compound semiconductor absorption layer 202 and smaller than the band gap of the charge sheet layer 207. The band gap of the compound semiconductor grading layer 204 may gradually increase from the compound semiconductor absorption layer 202 to the charge sheet layer 207. In this case, the compound semiconductor grading layer 204 may include a plurality of grading layers that are sequentially stacked thereon. The compound semiconductor grading layer 204 may be formed of indium gallium arsenic phosphide (InGaAsP). The composition ratio of the indium gallium arsenic phosphide (InGaAsP) may be varied to control the band gap.

A compound semiconductor amplification layer 209 is formed on the charge sheet layer 207. The compound semiconductor amplification layer 209 may be formed of a compound semiconductor including Group 3A (or Group 13) elements or Group 5A (or Group 15) elements. For example, the compound semiconductor amplification layer 209 may be formed of undoped indium phosphide (InP). A selective wet etch layer 210 is formed on the compound semiconductor amplification layer 209. The selective wet etch layer 210 may be formed of indium aluminum arsenide (InAlAs). The selective wet etch layer 210 may include p-type dopants. The selective wet etch layer 210 may have a larger band gap than the compound semiconductor amplification layer 209, and may be lattice-matched to the compound semiconductor absorption layer 209. Since the selective wet etch layer 210 has a large band gap, a ling wavelength light can be easily transmitted through the selective wet etch layer 210. A p-type conductive layer 220 is formed on the selective wet etch layer 210. The p-type conductive layer 220 may include p-type dopants. The p-type conductive layer 220 may be formed of p-type indium phosphide (p-InP). For example, the p-type conductive layer 220 may include zinc (Zn) or cadmium (Cd) as p-type dopants.

The compound semiconductor absorption layer 202, the compound semiconductor grading layer 204, the charge sheet layer 207, the compound semiconductor amplification layer 209, the selective wet etch layer 210, and the p-type conductive layer 220 may be sequentially formed on the n-type substrate 200 through a metal organic chemical vapor deposition (MOCVD) process.

According to an exemplary embodiment of the present invention, the compound semiconductor amplification layer 209 can be formed through the MOCVD process without performing a separate diffusion process described with reference to FIG. 2. Thus, the compound semiconductor amplification layer 209 can have a uniform thickness and can have a good reproducibility.

Figure 4:
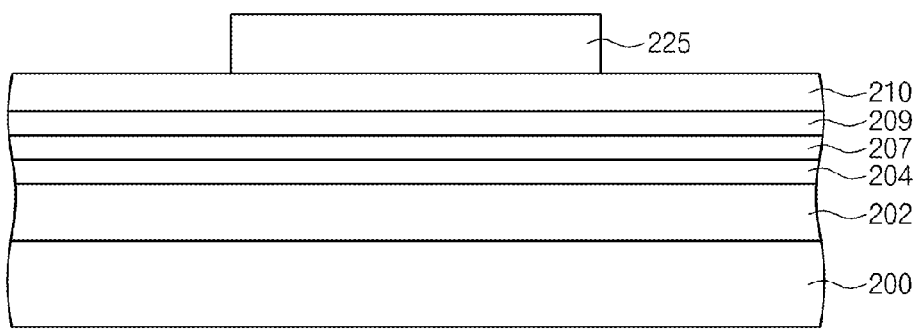

Referring to FIG. 4, the p-type conductive layer 220 is patterned to form a p-type conductive mesa pattern 225. The p-type conductive mesa pattern 225 may be formed through a plasma dry etch process. The p-type conductive mesa pattern 225 may define a region in which the avalanche photodiode operates.

Figure 5:
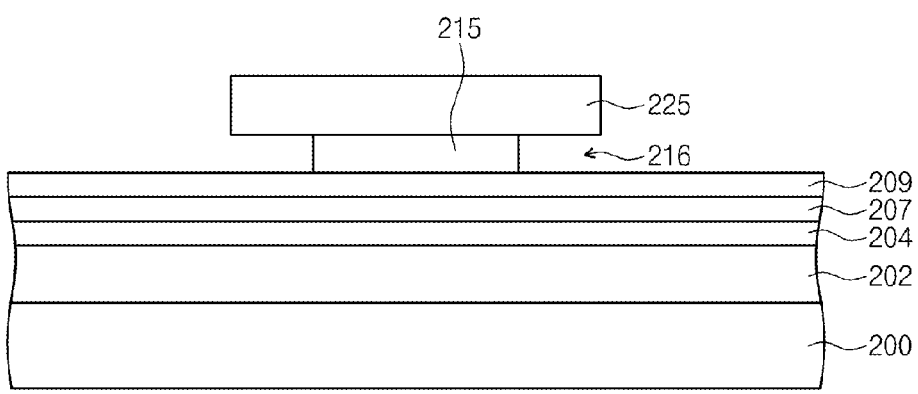

Referring to FIG. 5, the selective wet etch layer 210 is patterned to form a selective wet etch layer aperture pattern 215. The selective wet etch layer aperture pattern 215 may be formed through a selective wet etch process. The selective wet etch layer aperture pattern 215 may be selectively etched to form an undercut region 216. As illustrated in FIG. 5, the selective wet etch layer aperture pattern 215 may have a smaller width than the p-type conductive mesa pattern 225. The selective wet etch layer aperture pattern 215 may define an amplification region in the compound semiconductor amplification layer 209.

Figure 6:
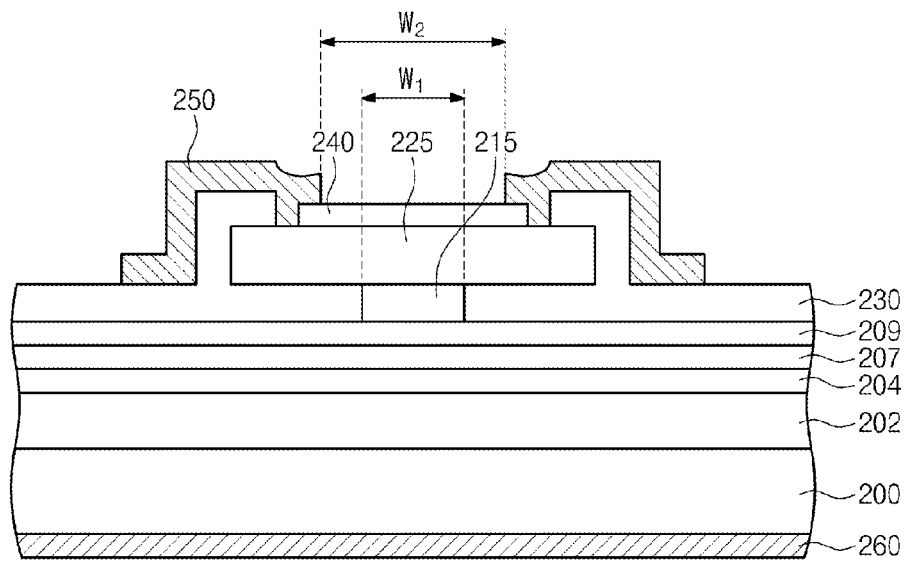

Referring to FIG. 6, a dielectric layer 230 is formed to fill the undercut region 216 and cover a portion of the p-type conductive mesa pattern 225 and the compound semiconductor amplification layer 209. The dielectric layer 230 may be formed through an atomic layer deposition (ALD) process. The dielectric layer 230 may be formed of various dielectric materials such as silicon oxide, silicon nitride, silicon oxynitride, and aluminum oxide. The dielectric layer 230 may expose a portion of the top surface of the p-type conductive mesa pattern 225.

An anti-reflective coating 240 is formed on the p-type conductive mesa pattern 225. A p-type metal electrode 250 is formed to contact the p-type conductive mesa pattern 225. An n-type metal electrode 260 is formed to contact the bottom surface of the n-type substrate 200. The p-type metal electrode 250 and the n-type metal electrode 260 may form an ohmic contact. The structured illustrated in FIG. 6 is a front incidence type avalanche photodiode. That is, light may enter through the p-type conductive mesa pattern 225 to generate avalanche multiplication.

According to an exemplary embodiment of the present invention, the p-type conductive mesa pattern 225 includes a light incidence region exposed by an opening of the p-type metal electrode 250, and the width $W_2$ of the light incidence region is larger than the width $W_1$ of the selective wet etch layer aperture pattern 215. Therefore, the light incidence area can be wide and the alignment margin of module packaging of the avalanche photodiode can be secured. Thus, the sensitivity of the avalanche photodiode can be improved by the wide light incidence area, and the reliability can be improved by the secured alignment margin of the module packaging. Meanwhile, since the interface between the compound semiconductor amplification layer 209 and the selective wet etch layer aperture pattern 215 is small, the parasitic capacitance can be reduced. Thus, the avalanche photodiode can operate at a high speed.

Figure 7:
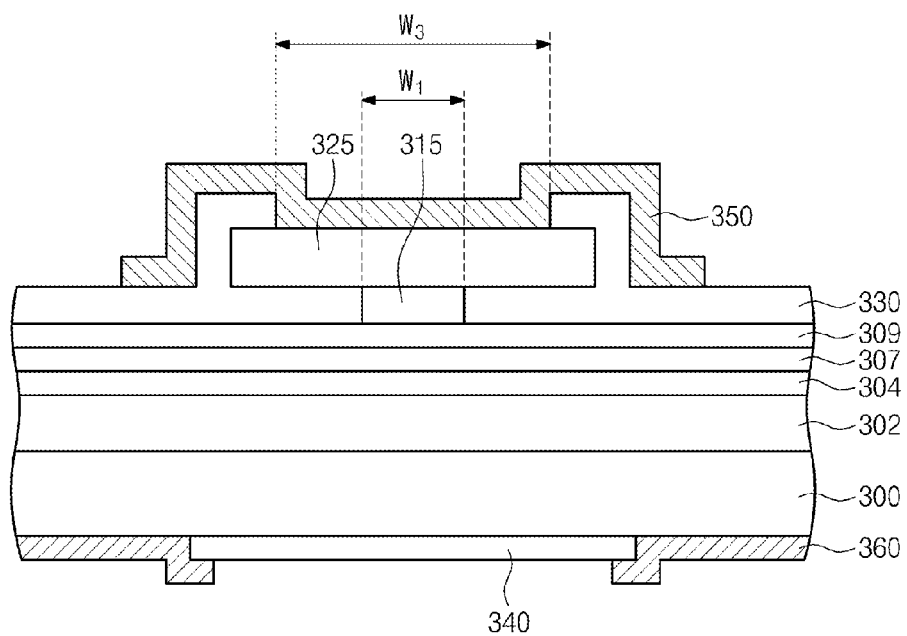
FIG. 7 is a cross-sectional view illustrating an avalanche photodiode according to another exemplary embodiment of the present invention.

FIG. 7 is a cross-sectional view illustrating an avalanche photodiode according to another exemplary embodiment of the present invention. A description of an overlap with FIGS. 3 to 5 will be omitted for conciseness.

Referring to FIG. 7, a compound semiconductor absorption layer 302 is formed on an n-type substrate 300. A compound semiconductor grading layer 304 is formed on the compound semiconductor absorption layer 302. A charge sheet layer 307 is formed on the compound semiconductor grading layer 304. A compound semiconductor amplification layer 309 is formed on the charge sheet layer 307. A selective wet etch layer aperture pattern 315 is formed on the compound semiconductor amplification layer 309. A p-type conductive mesa pattern 325 is formed on the selective wet etch layer aperture pattern 315.

A dielectric layer 330 is formed to cover a portion of the p-type conductive mesa pattern 325 and the compound semiconductor amplification layer 309. A p-type metal electrode 350 is formed to contact the p-type conductive mesa pattern 325. An anti-reflective coating 340 is formed on the bottom surface of the n-type substrate 300. An n-type metal electrode 360 is formed to contact the n-type substrate 300.

The structure illustrated in FIG. 7 is a rear incidence type avalanche photodiode. That is, light may enter through the n-type substrate 300 to generate avalanche multiplication.

According to another exemplary embodiment of the present invention, the p-type conductive mesa pattern 325 includes a light reflection region contacting the p-type metal electrode 350, and the width $W_3$ of the light reflection region is larger than the width $W_1$ of the selective wet etch layer aperture pattern 315. Therefore, the light reflection area can be wide and the alignment margin of module packaging of the avalanche photodiode can be secured. Thus, the sensitivity of the avalanche photodiode can be improved by the wide light reflection area, and the reliability can be improved by the secured alignment margin of the module packaging. Meanwhile, since the interface between the compound semiconductor amplification layer 309 and the selective wet etch layer aperture pattern 315 is small, the parasitic capacitance can be reduced. Thus, the avalanche photodiode can operate at a high speed.

An avalanche photodiode according to an exemplary embodiment of the present invention will be described below with reference to FIG. 6.

Referring to FIG. 6, a compound semiconductor absorption layer 202 is disposed on an n-type substrate 200. The n-type substrate 200 may be formed of a compound semiconductor including n-type dopants. For example, the n-type substrate 200 may be formed of indium phosphide (InP) including n-type dopants. The compound semiconductor absorption layer 202 may be formed of a compound semiconductor with a smaller band gap than the n-type substrate 200 and/or a subsequent undoped compound semiconductor amplification layer 209. For example, the compound semiconductor absorption layer 202 may be formed of indium gallium arsenide (InGaAs). The compound semiconductor absorption layer 202 absorbs light in the avalanche photodiode. The compound semiconductor absorption layer 202 may be formed to be in an intrinsic state.

A compound semiconductor grading layer 204 is disposed on the compound semiconductor absorption layer 202. The compound semiconductor grading layer 204 may be in an undoped state. A charge sheet layer 207 is disposed on the compound semiconductor grading layer 204. The charge sheet layer 207 may be formed of a compound semiconductor with a larger band gap than the compound semiconductor absorption layer 202. For example, the charge sheet layer 207 may be formed of indium phosphide (InP). The charge sheet layer 207 may include dopants. For example, the charge sheet layer 207 may include n-type dopants.

The compound semiconductor grading layer 204 may mitigate the band gaps of the compound semiconductor absorption layer 202 and the charge sheet layer 207. For example, the compound semiconductor grading layer 204 may be formed of a compound semiconductor with a band gap that is larger than the band gap of the compound semiconductor absorption layer 202 and smaller than the band gap of the charge sheet layer 207. The band gap of the compound semiconductor grading layer 204 may gradually increase from the compound semiconductor absorption layer 202 to the charge sheet layer 207. In this case, the compound semiconductor grading layer 204 may include a plurality of grading layers that are sequentially stacked thereon. The compound semiconductor grading layer 204 may be formed of indium gallium arsenic phosphide (InGaAsP). The composition ratio of the indium gallium arsenic phosphide (InGaAsP) may be varied to control the band gap.

A compound semiconductor amplification layer 209 is disposed on the charge sheet layer 207. The compound semiconductor amplification layer 209 may be formed of a compound semiconductor including Group 3A (or Group 13) elements or Group 5A (or Group 15) elements. For example, the compound semiconductor amplification layer 209 may be formed of undoped indium phosphide (InP). A selective wet etch layer aperture pattern 215 is disposed on the compound semiconductor amplification layer 209. The selective wet etch layer aperture pattern 215 may be formed of indium aluminum arsenide (InAlAs). The selective wet etch layer aperture pattern 215 may include p-type dopants. The selective wet etch layer aperture pattern 215 may have a larger band gap than the compound semiconductor amplification layer 209, and may be lattice-matched to the compound semiconductor absorption layer 209. Since the selective wet etch layer aperture pattern 215 has a large band gap, light can easily enter through the selective wet etch layer aperture pattern 215.

A p-type conductive mesa pattern 225 is disposed on the selective wet etch layer aperture pattern 215. The p-type conductive mesa pattern 225 may be formed of indium phosphide (InP). For example, the p-type conductive mesa pattern 225 may include zinc (Zn) or cadmium (Cd) as p-type dopants. The p-type conductive mesa pattern 225 may define a region in which the avalanche photodiode operates.

The width $W_2$ of the p-type conductive mesa pattern 225 may be larger than the width $W_1$ of the selective wet etch layer aperture pattern 215. The selective wet etch layer aperture pattern 215 may define an amplification region in the compound semiconductor amplification layer 209.

According to an exemplary embodiment of the present invention, the p-type conductive mesa pattern 225 includes a light incidence region exposed by an opening of the p-type metal electrode 250, and the width $W_2$ of the light incidence region is larger than the width $W_1$ of the selective wet etch layer aperture pattern 215. Therefore, the light incidence area can be wide and the alignment margin of module packaging of the avalanche photodiode can be secured. Thus, the sensitivity of the avalanche photodiode can be improved by the wide light incidence area, and the reliability can be improved by the secured alignment margin of the module packaging. Meanwhile, since the interface between the compound semiconductor amplification layer 209 and the selective wet etch layer aperture pattern 215 is small, the parasitic capacitance can be reduced. Thus, the avalanche photodiode can operate at a high speed.

A dielectric layer 230 is disposed to cover a portion of the p-type conductive mesa pattern 225 and the compound semiconductor amplification layer 209. The dielectric layer 230 may be formed of various dielectric materials such as silicon oxide, silicon nitride, and silicon oxynitride. The dielectric layer 230 may expose a portion of the top surface of the p-type conductive mesa pattern 225.

An anti-reflective coating 240 is disposed on the p-type conductive mesa pattern 225. A p-type metal electrode 250 is disposed to contact the p-type conductive mesa pattern 225. An n-type metal electrode 260 is disposed to contact the bottom surface of the n-type substrate 200. The structured illustrated in FIG. 6 is a front incidence type avalanche photodiode. That is, light may enter through the p-type conductive mesa pattern 225 to generate avalanche multiplication.

An avalanche photodiode according to another exemplary embodiment of the present invention will be described below with reference to FIG. 7. A description of an overlap with FIG. 6 will be omitted for conciseness.

Referring to FIG. 7, a compound semiconductor absorption layer 302 is disposed on an n-type substrate 300. A compound semiconductor grading layer 304 is disposed on the compound semiconductor absorption layer 302. A charge sheet layer 307 is disposed on the compound semiconductor grading layer 304. A compound semiconductor amplification layer 309 is disposed on the charge sheet layer 307. A selective wet etch layer aperture pattern 315 is disposed on the compound semiconductor amplification layer 309. A p-type conductive mesa pattern 325 is disposed on the selective wet etch layer aperture pattern 315.

A dielectric layer 330 is disposed to cover a portion of the p-type conductive mesa pattern 325 and the compound semiconductor amplification layer 309. A p-type metal electrode 350 is disposed to contact the p-type conductive mesa pattern 325. An anti-reflective coating 340 is disposed on the bottom surface of the n-type substrate 300. An n-type metal electrode 360 is disposed to contact the n-type substrate 300.

The structure illustrated in FIG. 7 is a rear incidence type avalanche photodiode. That is, light may enter through the n-type substrate 300 to generate avalanche multiplication.

According to another exemplary embodiment of the present invention, the p-type conductive mesa pattern 325 includes a light reflection region contacting the p-type metal electrode 350, and the width $W_3$ of the light reflection region is larger than the width $W_1$ of the selective wet etch layer aperture pattern 315. Therefore, the light reflection area can be wide and the alignment margin of module packaging of the avalanche photodiode can be secured. Thus, the sensitivity of the avalanche photodiode can be improved by the wide light reflection area, and the reliability can be improved by the secured alignment margin of the module packaging.

As described above, according to the exemplary embodiments of the present invention, the amplification layer and the p-type conductive layer of the avalanche photodiode can be formed through a metal organic chemical vapor deposition (MOCVD) process without performing a separate diffusion process. Thus, since the amplification layer is formed by epitaxial growth without a depth control error caused by a diffusion process. Therefore, the multiplication factor of avalanche multiplication can be accurately controlled, thus making it possible to improve the sensitivity of the avalanche photodiode and secure the reproducibility. Also, the width of the p-type conductive mesa pattern is larger than the width of the selective wet etch layer aperture pattern. Therefore, the light incidence area can be wide and the alignment margin of module packaging of the avalanche photodiode can be secured. Thus, the sensitivity of the avalanche photodiode can be improved by the wide light incidence area, and the reliability can be improved by the secured alignment margin of the module packaging. Meanwhile, since the interface between the compound semiconductor amplification layer and the selective wet etch layer aperture pattern is small, the parasitic capacitance can be reduced. Thus, the avalanche photodiode can operate at a high speed.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating an avalanche photodiode, comprising:
    forming a compound semiconductor absorption layer, a compound semiconductor grading layer, a charge sheet layer, a compound semiconductor amplification layer, a selective wet etch layer, and a p-type conductive layer on an n-type substrate, wherein the compound semiconductor absorption layer, the compound semiconductor grading layer, the charge sheet layer, the compound semiconductor amplification layer, the selective wet etch layer, and the p-type conductive layer are sequentially formed on the n-type substrate through a metal organic chemical vapor deposition process;
    forming a p-type conductive mesa pattern by performing a plasma dry etch process on the p-type conductive layer; and
    forming an undercut region and a selective wet etch layer aperture pattern under the p-type conductive mesa pattern by performing a wet etch process on the selective wet etch layer by using the p-type conductive mesa pattern as an etch mask.

2. The method of claim 1, further comprising:
    forming a dielectric layer to fill the undercut region and cover a portion of the p-type conductive mesa pattern and the compound semiconductor amplification layer.

3. The method of claim 2, wherein the dielectric layer is formed through an atomic layer deposition process.

4. The method of claim 1, further comprising:
    forming an anti-reflective coating on the p-type conductive mesa pattern;
    forming a p-type metal electrode connected to the p-type conductive mesa pattern; and
    forming an n-type metal electrode connected to the n-type substrate,
    wherein the p-type conductive mesa pattern comprises a light incidence region exposed by an opening of the p-type metal electrode, and a width of the light incidence region is larger than a width of the selective wet etch layer aperture pattern.

5. The method of claim 1, further comprising:
    forming an anti-reflective coating on a bottom surface of the n-type substrate;

forming an n-type metal electrode connected to the n-type substrate; and forming a p-type metal electrode connected to the p-type conductive mesa pattern, wherein the p-type conductive mesa pattern comprises a light reflection region contacting the p-type metal electrode, and a width of the light reflection region is larger than a width of the selective wet etch layer aperture pattern.

* * * * *